United States Patent
Kettinger et al.

(10) Patent No.: US 11,604,240 B2
(45) Date of Patent: Mar. 14, 2023

(54) METHOD FOR RECORDING MEASUREMENT DATA USING A MAGNETIC RESONANCE SYSTEM WITH A CORRECTION OF K-SPACE TRAJECTORIES

(71) Applicant: Siemens Healthcare GmbH, Erlangen (DE)

(72) Inventors: Adam Kettinger, Bayern (DE); Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/383,506

(22) Filed: Jul. 23, 2021

(65) Prior Publication Data
US 2022/0026513 A1    Jan. 27, 2022

(30) Foreign Application Priority Data
Jul. 24, 2020   (DE) .......................... 102020209383.0

(51) Int. Cl.
*G01V 3/00*   (2006.01)
*G01R 33/48*   (2006.01)
(Continued)

(52) U.S. Cl.
CPC ....... *G01R 33/4826* (2013.01); *G01R 33/543* (2013.01); *G01R 33/565* (2013.01)

(58) Field of Classification Search
CPC ............. G01R 33/543; G01R 33/5659; G01R 33/3415; G01R 33/36; A61B 5/055
(Continued)

(56) References Cited

U.S. PATENT DOCUMENTS 8,981,776 B2    3/2015 Setsompop et al.
2005/0264288 A1*  12/2005 Campagna ....... G01R 33/56375
                                                          324/309
(Continued)

FOREIGN PATENT DOCUMENTS

DE    102017222359 A1    6/2019

OTHER PUBLICATIONS

Vannesjo et al., "Image Reconstruction Using a Gradient Impulse Response Model for Trajectory Prediction," Magnetic Resonance in Medicine, vol. 76, pp. 45-58 (2016).
(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

In a method for recording measurement data, frequency-dependent parameters characterizing a gradient unit are loaded, a k-space trajectory planned for a MR measurement and having at least one frequency component is loaded, MR measurement data is acquired based on the planned k-space trajectory and reconstructing image data from the MR measurement data, wherein the planned k-space trajectory is corrected based on the at least one frequency component of the planned k-space trajectory and the frequency-dependent parameters, and an electronic signal representing the reconstructed image data is provided as an output of the MR system. The reconstructed image data may be stored and/or displayed. Advantageously, the correction can be employed flexibly for k-space trajectories with different frequency components.

17 Claims, 4 Drawing Sheets

Figure 1:
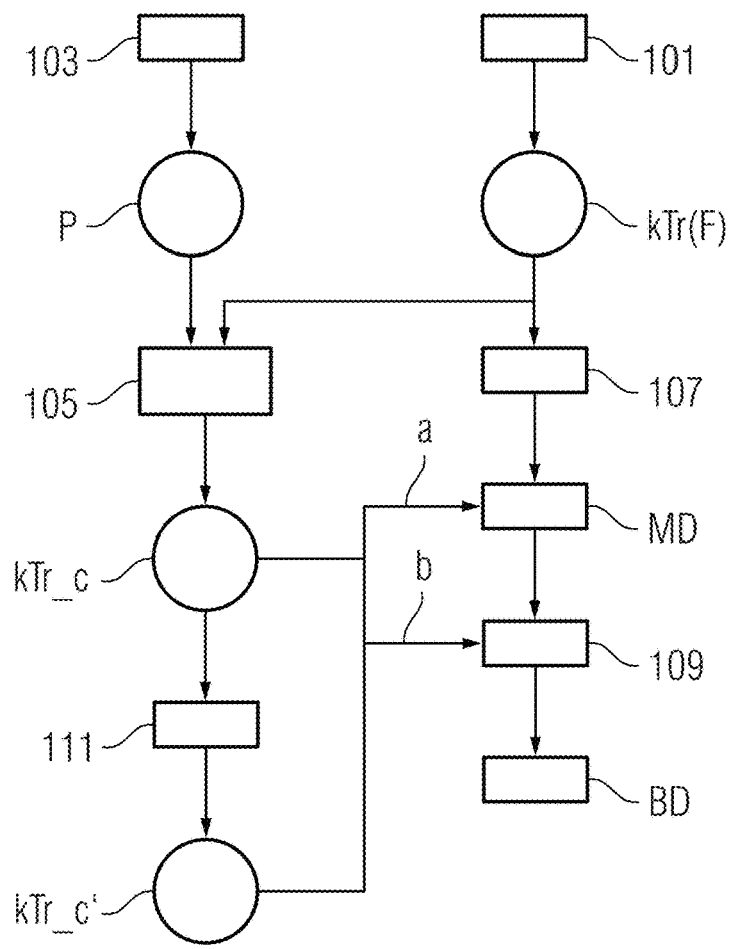

(51) Int. Cl.
    *G01R 33/565* (2006.01)
    *G01R 33/54* (2006.01)
(58) Field of Classification Search
    USPC .................................................... 324/309
    See application file for complete search history.

(56) References Cited

U.S. PATENT DOCUMENTS

| | | | | |
|---|---|---|---|---|
| 2018/0329010 | A1* | 11/2018 | Kluge | G01R 33/56572 |
| 2019/0086494 | A1* | 3/2019 | Pfeuffer | G01R 33/543 |
| 2019/0178965 | A1 | 6/2019 | Paul et al. | |
| 2020/0278412 | A1 | 9/2020 | Paul et al. | |

OTHER PUBLICATIONS

Bilgic et al., "Wave-CAIPI for Highly Accelerated 3D Imaging," Magnetic Resonance in Medicine, vol. 73, No. 6, pp. 2152-2162 (2015).

Gagoski et al., "RARE/Turbo Spin Echo Imaging with Simultaneous Multislice Wave-CAIPI," Magnetic Resonance in Medicine, vol. 73, pp. 929-938 (2015).

Breuer et al., "Controlled Aliasing in Parallel Imaging Results in Higher Acceleration (CAIPIRINHA) for Multi-Slice Imaging," Magnetic Resonance in Medicine, vol. 53, No. 3, pp. 684-691 (2005).

S. Vannesjo, "Doctoral Thesis, Characterizing and Correcting for Imperfect Field Dynamics in Magnetic Resonance Imaging," ETH-ZÜRICH, pp. 9-23, 136-147 (2013).

Vannesjo et al., "Gradient System Characterization by Impulse Response Measurements with a Dynamic Field Camera," Magnetic Resonance in Medicine, vol. 69, pp. 583-593 (2013).

Setsompop et al., "Blipped-Controlled Aliasing in Parallel Imaging for Simultaneous Multislice Echo Planar Imaging with Reduced g-Factor Penalty," Magnetic Resonance in Medicine, vol. 67, pp. 1210-1224 (2012).

Cauley et al., "Autocalibrated Wave-CAIPI Reconstruction; Joint Optimization of k-Space Trajectory and Parallel Imaging Reconstruction," Magnetic Resonance in Medicine, vol. 78, No. 3, pp. 1093-1099 (2016).

Chen et al., "Self-Calibrating Wave-Encoded Variable-Density Single-Shot Fast Spin Echo Imaging," Journal of Magnetic Resonance Imaging (2017).

Stich et al., "Gradient waveform pre-emphasis based on the gradient system transfer function," Magnetic Resonance in Medicine, vol. 80, pp. 1521-1532 (2018).

German Office Action for Application No. 10 2020 209 383.0 dated May 21, 2021.

Porter et al., "High Resolution Diffusion-Weighted Imaging Using Readout-Segmented Echo-Planar Imaging, Parallel Imaging and a Two-Dimensional Navigator-Based Reacquisition," Magnetic Reosnance in Medicine, vol. 62, pp. 468-475 (2009).

* cited by examiner

METHOD FOR RECORDING MEASUREMENT DATA USING A MAGNETIC RESONANCE SYSTEM WITH A CORRECTION OF K-SPACE TRAJECTORIES

CROSS REFERENCE TO RELATED APPLICATIONS

This patent application claims priority to German Patent Application No. 10 2020 209 383.0, filed Jul. 24, 2020, which is incorporated herein by reference in its entirety.

BACKGROUND

Field

The disclosure relates to a method for recording measurement data by means of a magnetic resonance system with a correction of the k-space trajectories used.

Related Art

Magnetic resonance (MR) technology is a known technology with which images of the interior of an object under examination can be generated. In simplified terms, to this end the object under examination is positioned in a magnetic resonance device in a comparatively strong static, homogeneous constant magnetic field, also called a $B_0$ field, with field strengths of 0.2 Tesla to 7 Tesla and more, such that its nuclear spins are oriented along the constant magnetic field. To trigger nuclear spin resonances measurable as signals, radio-frequency excitation pulses (RF pulses) are beamed into the object under examination, the triggered nuclear spin resonances are measured as what is known as k-space data and on the basis thereof MR images are reconstructed or spectroscopy data is determined. For position encoding of the measurement data the constant magnetic field is overlaid with rapidly switched magnetic gradient fields, referred to as gradients for short. A diagram used, which describes a sequence over time of RF pulses to be beamed in and gradients to be switched, is designated as a pulse sequence (diagram), or also as a sequence for short. The plotted measurement data is digitized and stored as complex numerical values in a k-space matrix (also designated as a "k-space" for short). An associated MR image can be reconstructed from the k-space matrix populated with values, e.g. by means of a multidimensional Fourier transform.

So-called parallel acquisition technologies (ppa), such as e.g. GRAPPA ("GeneRalized Autocalibrating Partially Parallel Acquisition") or SENSE ("Sensitivity Encoding"), in which only one quantity of measurement data subsampled in k-space in accordance with the Nyquist theorem can be recorded with the help of multiple RF coils, can be used in order e.g. to reduce the measurement time needed overall to record the measurement data or to increase the resolution. The "missing" measurement data, i.e. the measurement data not measured but required for a complete set of measurement data in accordance with Nyquist, is here supplemented on the basis of sensitivity data of the RF coils and calibration data used and the measurement data measured.

The desire for ever faster MR scans in the clinical environment is leading on the one hand to a renaissance of methods in which multiple images are recorded simultaneously. Generally these methods can be characterized in that, at least during part of the measurement, transverse magnetization of at least two slices is selectively used simultaneously for the imaging process ("Multi-Slice Imaging", "Slice Multiplexing", "Simultaneous Multi-Slice" (SMS)). In contrast, in the established "Multi-Slice Imaging" the signal from at least two slices is recorded alternately, i.e. completely independently of one another with a correspondingly longer measurement time.

Known SMS methods are for example methods which in the slice direction employ methods from the aforementioned imaging by means of ppa, in which knowledge of the sensitivity distribution of the receiver coils used during the acquisition of the measurement data is used as additional information, in order to replenish measurement data subsampled in accordance with Nyquist, in order to separate signals recorded from multiple slices into signals of the individual slices. These methods for example also include CAIPIRINHA technology, as described by Breuer et al. in "Controlled Aliasing in Parallel Imaging Results in Higher Acceleration (CAIPIRINHA) for Multi-Slice Imaging", Magnetic Resonance in Medicine 53, 2005, p. 684-691, and blipped CAIPIRINHA technology, as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, p. 1210-1224, wherein the g-factor (short for "geometry factor") referred to in the latter title represents a measurement for the separability of the different receiver coils used.

As a method for further reducing this g-factor, it is furthermore known for CAIPIRINHA methods to change the readout trajectories in k-space, and thus the acquisition diagram, such that the measurement data is acquired along wavelike or helical readout trajectories. This is described for example in U.S. Pat. No. 8,981,776B2, in the article by Bilgic et al. "Wave-CAIPI for Highly Accelerated 3D Imaging", Magnetic Resonance in Medicine 73:2152-2162 (2015), or, for two-dimensional (2D) imaging in Chen et al. "Self-Calibrating Wave-Encoded Variable-Density Single-Shot Fast Spin Echo Imaging", J. Magn. Reson. Imaging 2018; 47:954-966, or also for Spinecho (SE) methods in Gagoski et al. "RARE/Turbo Spin Echo Imaging with Simultaneous Multislice Wave-CAIPI", Magn. Reson. Med. 73:929-938 (2015).

In brief, for wave technologies such as these at least one sinusoidally modulated gradient is utilized in a direction lying perpendicular to the readout direction during the readout process simultaneously with a gradient in the readout direction. A wavelike or helical k-space trajectory obtained in this way distributes artifacts, such as e.g. aliasing artifacts, such as occur due to subsampling of k-space being applied in order to reduce the measurement time, in at least two, or, for helical k-space trajectories, in all spatial directions, and thus enables even sensitivity data of the RF coils used to be employed in multiple (all three) spatial directions, which results in the mentioned reduction in the g-factor. Thus for example higher accelerations, in other words a stronger subsampling, can be employed with wave technologies, while maintaining the same quality of the image data obtained compared to "non-wave ppa technologies" with a lower acceleration.

However, wave technologies prove to be particularly sensitive in respect of imperfections in the gradients used during the readout process, such that deviations in the gradients actually generated during a measurement during a readout period from the respective ideal gradients planned for this readout period result in artifacts in the ultimately obtained image data.

Such deviations from gradients actually generated during a measurement during a readout period from the respective gradients planned for this readout period occur regularly, however, for example because of high currents in the respective gradient coils and effects caused as a result, such as eddy currents, higher-order fields, etc.

Attempts are already made to moderate the negative effects of these deviations by taking into account known, static, constant time delays of the respective gradient coils retrospectively during the reconstruction. However, this procedure leaves out of consideration frequency-dependent components of the delays in the switched gradients and deviations caused thereby and any deviations in the achieved magnitudes of the switched gradients from the planned gradients, as a result of which only a possibly insufficient removal of artifacts can be achieved using this inflexible approach.

Furthermore, for example in the article by Cauley et al. "Autocalibrated Wave-CAIPI Reconstruction; Joint Optimization of k-Space Trajectory and Parallel Imaging Reconstruction", Magnetic Resonance in Medicine 78, 2017, p. 1093-1099, an iterative method is described which varies frequency parameters of the so-called "Point Spread Function" PSF, which describes the propagation of aliasing artifacts in subsampling diagrams, and compares the reconstruction results obtained with the various frequency parameters at selected test positions by way of their root mean square error (RMSE). If the RMSE approaches a local minimum, the associated value of the frequency parameter is assumed to be that of the PSF being searched for. Based on the PSF found, a correction of the deviation of the gradients for wave k-space trajectories is described. For such methods, a longer time may potentially be needed to find the PSFs being searched for.

In recent years, system-specific gradient impulse response functions (GIRF) have been examined. These involve interactions between the individual gradient fields which are generated by the gradient coils. In other words GIRF describe the effect of the gradient axes on one another, if for example a gradient generated on a first axis influences the gradient curves of at least one other axis, which contributes to the deviations from planned and actually utilized gradients as already mentioned above. The causes for this lie for example in the coil geometry, by which the coils inductively mutually influence one another, and the electronic signal paths.

To obtain information about the behavior of gradient units, methods have been developed to determine these GIRF. For example, the article by Signe Johanna Vannesjö et al. "Gradient System Characterization by Impulse Response Measurements with a Dynamic Field Camera", Magnetic Resonance in Medicine 69, 2013, p. 583-593, describes a method for recording GIRF with the help of field cameras.

Theoretically the gradient actually achieved by the gradient unit can be determined from a known GIRF of a gradient unit and from a nominal, planned gradient (in its temporal progression) by a convolution of the GIRF with a nominal, planned gradient. Convolutions such as this are however associated with a high computational effort.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 a flowchart of a method according to an exemplary embodiment.

Figure 2:
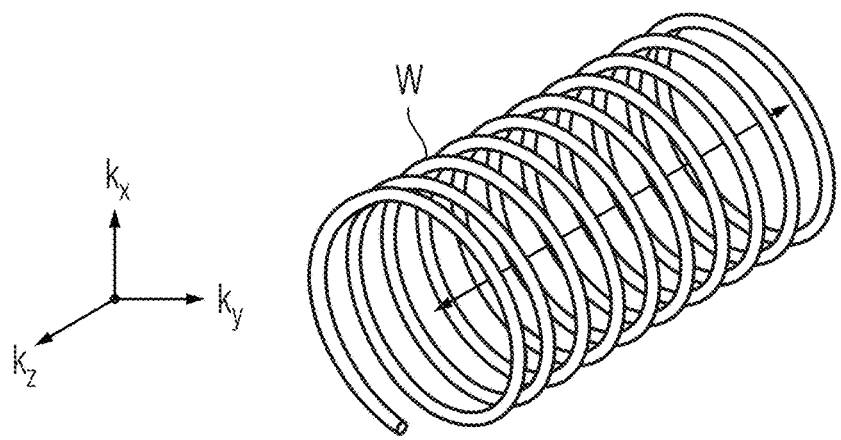

FIG. 2 a helical k-space trajectory according to an exemplary embodiment.

Figure 3:
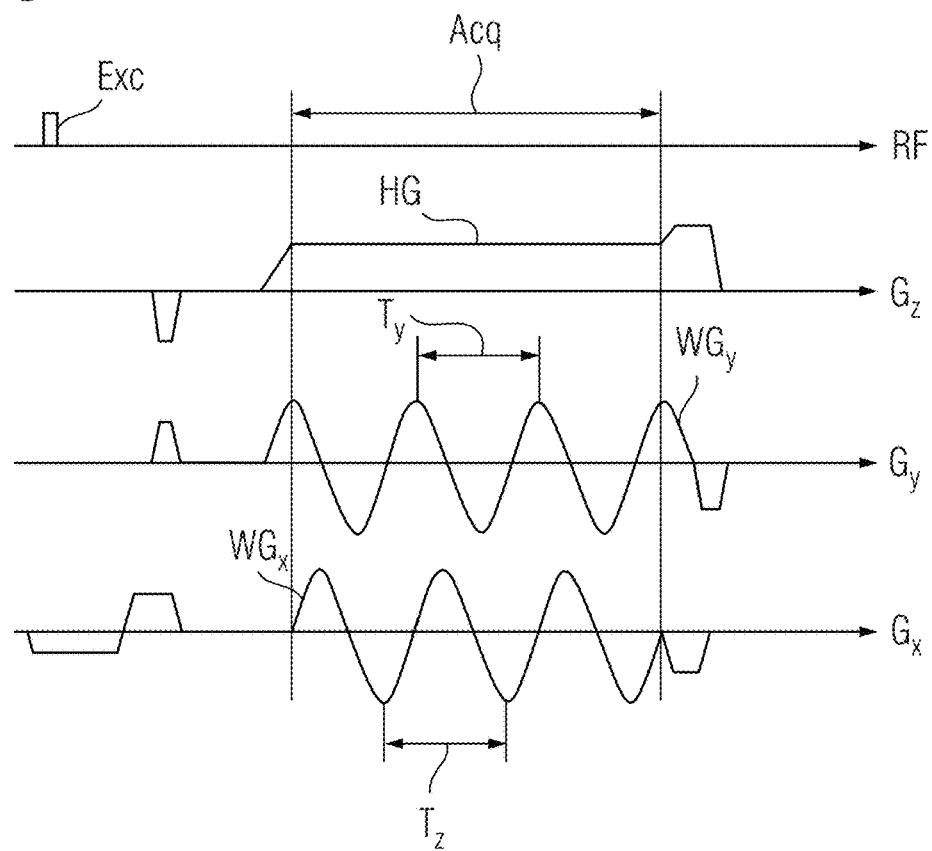

FIG. 3 a pulse sequence diagram for recording measurement data, according to an exemplary embodiment, with which a k-space trajectory according to FIG. 2 may be achieved.

Figure 4:
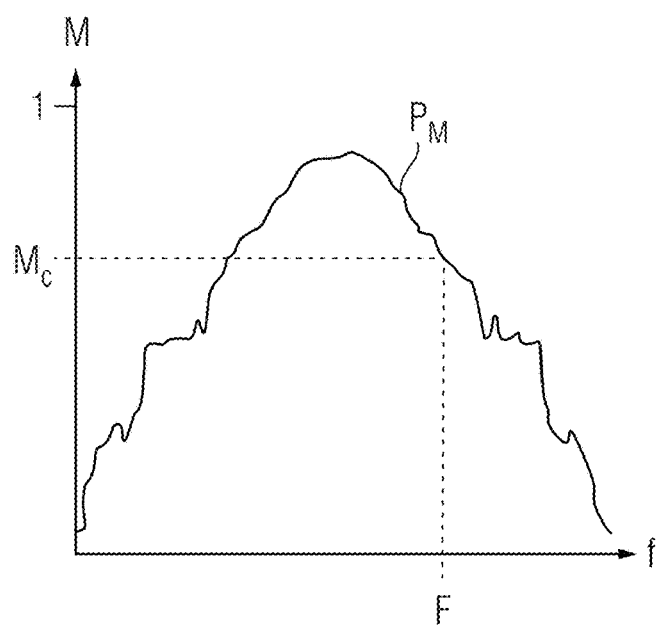

FIG. 4 a plot of a first frequency-dependent parameter characterizing a gradient unit of a magnetic resonance system, according to an exemplary embodiment.

Figure 5:
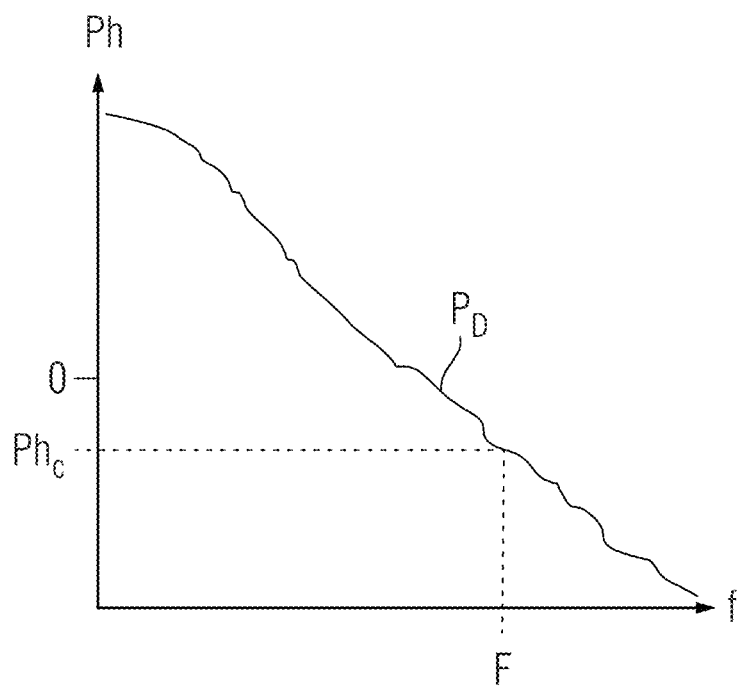

FIG. 5 a plot of a second frequency-dependent parameter characterizing a gradient unit of a magnetic resonance system, according to an exemplary embodiment.

Figure 6:
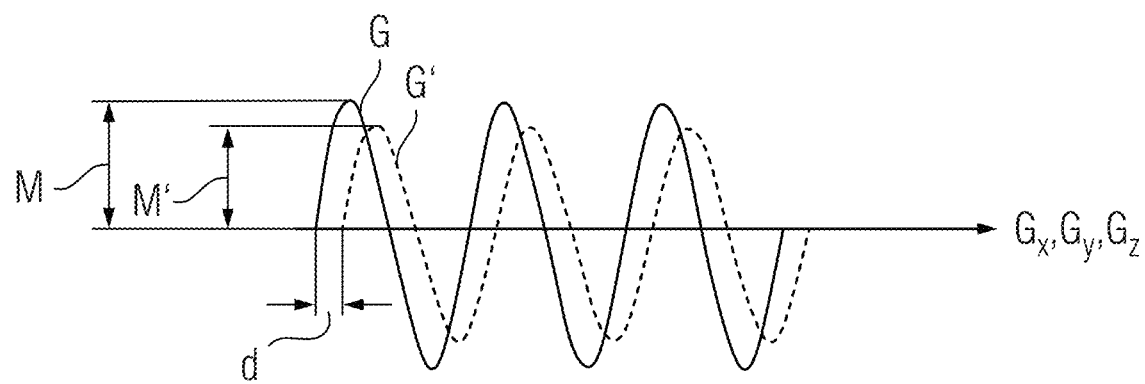

FIG. 6 a plot of a comparison of a gradient of a planned k-space trajectory having a frequency-dependent component and of a corrected gradient of a corrected k-space trajectory determined on the basis of parameters characterizing a gradient unit used and of the planned k-space trajectory, according to an exemplary embodiment.

Figure 7:
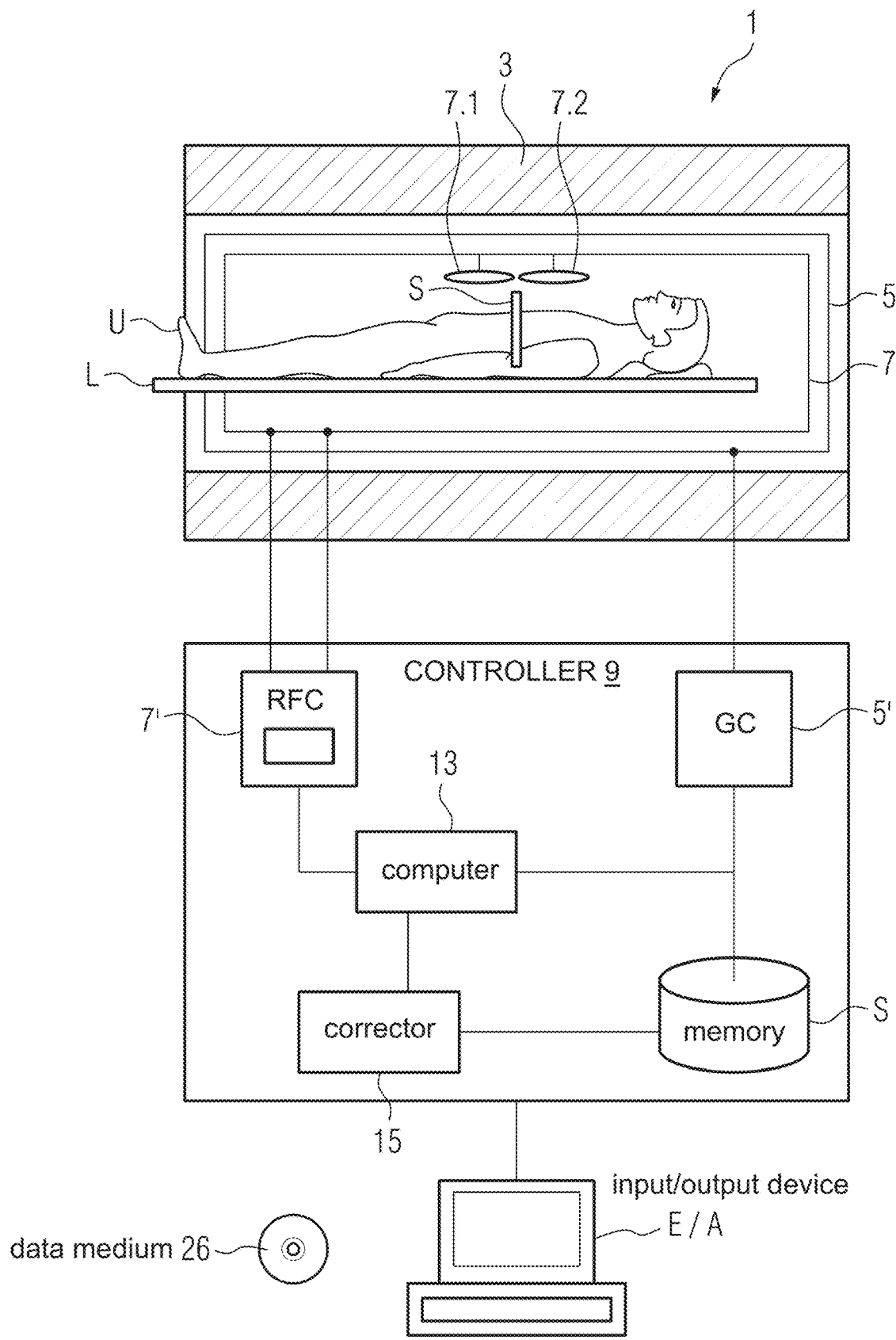

FIG. 7 a magnetic resonance system according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure is to permit a correction, for different readout trajectories, of deviations in the gradients actually generated during a measurement during a readout period from the respective ideal gradients planned for this readout period, said correction being flexible and at the same time fast and requiring little computational effort.

For k-space trajectories having a frequency component, such as, for example, in the context of wave technologies already mentioned above, in which during a readout period switched gradients fixing the k-space trajectory in each case have at least one frequency component, e.g. in each case the one corresponding to the sinusoidal modulation of the wave gradients in a maximum of two of the possible directions, a complex convolution can be dispensed with and the procedure described below can be followed.

A method for recording measurement data, according to an exemplary embodiment, using a magnetic resonance system having a gradient unit, includes:
- loading frequency-dependent parameters characterizing the gradient unit of the magnetic resonance system,
- loading a k-space trajectory planned for a magnetic resonance measurement and having at least one frequency component,
- acquiring magnetic resonance measurement data on the basis of the planned k-space trajectory and reconstruction of image data from the magnetic resonance measurement data, wherein the planned k-space trajectory is corrected on the basis of at least one frequency component of the planned k-space trajectory and the characterizing parameters,
- storing and/or displaying the reconstructed image data.

The inventive method permits a correction of k-space trajectories and thus an avoidance of artifacts in a simple manner requiring little computational effort as a function of a frequency component of a planned k-space trajectory and in the knowledge of the behavior, in particular the response to a request for the generation of desired gradient fields, of the gradient unit used. Thanks to the thereby generated frequency dependency of the correction, the correction can be flexibly employed for k-space trajectories with different frequency components.

GIRF describe the behavior of gradient units and can be determined relatively simply and have a frequency dependency. Thus as frequency-dependent parameters characterizing the gradient unit they are well suited for the method.

A magnetic resonance (MR) system according to an exemplary embodiment includes a magnet unit, a gradient unit, a radio-frequency unit and a controller with a corrector embodied for the performance of an inventive method.

An inventive computer program implements an inventive method on a controller, when it is executed on the controller.

The computer program can hereby also be present in the form of a computer program product which can be loaded directly into a memory of a controller, with program encoding means in order to execute an inventive method, when the computer program product is executed in the computing unit of the computing system.

An inventive electronically readable data medium comprises electronically readable control information stored thereon, comprising at least one inventive computer program and being embodied such that when the data medium is used in a controller of a magnetic resonance system said control information performs an inventive method.

The advantages and embodiments stipulated in respect of the method also apply analogously for the magnetic resonance system, the computer program product and the electronically readable data medium.

FIG. 1 is a schematic flowchart of an inventive method for recording measurement data by means of a magnetic resonance system which comprises a gradient unit.

In the method at least one planned k-space trajectory kTr(F) is loaded which has at least one frequency component F (Block 101). Loading planned k-space trajectories comprises in particular loading the gradient fields $G_x$, $G_y$, $G_z$ which nominally result in the desired planned k-space trajectory. A loaded k-space trajectory kTr(F) can be calculated beforehand in a known manner.

FIG. 2 shows as an example of a possible k-space trajectory having a frequency component an exemplary helical k-space trajectory W, as can be generated using wave technology. The k-space trajectory represented runs helically along a main direction HR (double arrow), here the $k_z$ direction, with in each case a magnitude and a frequency in directions lying perpendicular to the main direction and to one another, as defined by gradients in the $k_x$ and $k_y$ direction switched during the readout time. The frequency or frequencies used (each) produce a frequency component F of the k-space trajectory W.

For further explanation, a schematic representation of part of a pulse sequence diagram for acquiring measurement data with which a k-space trajectory W in accordance with FIG. 2 can be achieved is shown in FIG. 3.

The gradients used for the position encoding of the signals measured in a readout period are generally generated as gradient fields on the orthogonal axes x, y, and z, wherein the z direction, but sometimes also the x direction, is in most cases defined as pointing in the direction of the main magnetic field. The directions x, y and z can be renamed without loss of generality. The gradient fields $G_x$, $G_y$, $G_z$ are generated by means of three gradient coils, each of which generate a field in the x, y and z direction.

To record measurement data of a target area of an object under examination, spins in the target area are excited in the usual manner by means of an excitation Exc and the echo signals generated by the excitation Exc are recorded as measurement data in a readout period Acq. During the readout period Acq, readout gradients HG, $WG_y$, $WG_x$ are switched for spatial encoding, and fix the k-space trajectory along which the measurement data recorded in a readout period Acq is sampled. In the example shown, a main readout gradient HG is switched in a main readout direction $G_z$ and has a constant magnitude during the readout period Acq. Simultaneously with the main readout gradient HG, thus likewise during the readout period Acq, at least one further readout gradient $WG_y$ and/or $WG_x$ is switched, wherein further readout gradients have an e.g. sinusoidally modulating magnitude, e.g. between a positive value of the maximum magnitude and the negative value of the maximum magnitude, each with a frequency $f_y=1/T_y$ or $f_x=1/T_x$, and are switched in a direction $G_y$ or $G_x$ lying perpendicular to the main readout direction $G_z$. Switched further readout gradients $WG_y$, $WG_x$ thus have a frequency component corresponding to their respective modulation frequency. A further readout gradient $WG_y$ thus in particular has a frequency component F of the frequency $f_y$, a further readout gradient $WG_x$ a frequency component F of the frequency $f_x$. Further gradients, in particular for any desired dephasing or rephasing of the manipulated spins, can be switched into all gradient axes $G_x$, $G_y$, $G_z$ before and/or after the readout period Acq.

The directions $G_y$ and $G_x$ here likewise lie perpendicular to one another. This results in a k-space trajectory W which in k-space runs in the direction $k_z$ corresponding to the main readout direction $G_z$ and thereby is likewise modulated by the direction $k_x$ in accordance with the modulation of the switched further readout gradients $WG_y$ and $WG_z$, as represented e.g. in FIG. 2. The modulation of the k-space trajectory by the direction $k_z$ corresponding to the main readout direction $G_z$ can here also be wavelike (if only one further readout gradient $WG_y$ or $WG_x$ is switched) or, as represented in FIG. 2, helical (if two further readout gradients $WG_y$ and $WG_x$ are switched).

In order to record a set of measurement data of a target area of an object under examination, from which image data of the target area can be reconstructed, a diagram represented in FIG. 3 is repeated continuously in a normal manner, e.g. with different phase encoding by switching different gradients in the phase encoding direction (not shown) between the excitation Exc and the readout period Acq or else with different main readout directions $G_z$, until a set of measurement data sufficient for the reconstruction of the desired image data has been recorded.

Furthermore, frequency-dependent parameters P characterizing the gradient unit of the magnetic resonance system are loaded, e.g. from a memory (Block 103). The loaded characterizing parameters P describe in particular interactions between gradient fields generated by the respective gradient coils, which for example are influenced by the geometry of the gradient coils and describe the behavior of a gradient unit, in particular the latter's response to a request for the generation of desired gradient fields.

The loaded frequency-dependent parameters characterizing the gradient unit can be based on measured gradient impulse response functions (GIRF). The GIRF can be determined e.g. by means of sensors, such as field cameras, or also by means of dedicated measurements on the magnetic resonance system.

In this case not all characterizing parameters present for the gradient unit of the magnetic resonance system need be loaded, but it may be sufficient to load characterizing parameters at least for one gradient coil of the gradient unit corresponding to an axis of the gradient unit, in particular for the axis/axes for which the planned k-space trajectory kTr(F) has a frequency component F.

FIG. 4 shows an exemplary representation of a first frequency-dependent parameter $P_M$ characterizing a gradient unit of a magnetic resonance system, e.g. for an axis. The parameter $P_M$ for example indicates a progression of a magnitude M, achieved by the gradient unit, of a gradient field in the frequency domain f generated thereby, and shows by way of example a typical lowpass filter characteristic. The parameter $P_M$ can, based on parameters P describing a behavior of a gradient unit, such as e.g. a GIRF measured at the gradient unit, be determined by a Fourier transform into the frequency domain and consideration of the magnitude of the result of the Fourier transform.

FIG. 5 shows an exemplary representation of a second frequency-dependent parameter $P_D$ characterizing a gradient unit of a magnetic resonance system, e.g. for an axis. The parameter $P_D$ for example indicates a progression of a phase Ph, achieved by the gradient unit, of a gradient field generated thereby in the frequency domain f. The parameter $P_D$ can for example, based on parameters P describing a behavior of a gradient unit, such as e.g. a GIRF measured at the gradient unit, be determined by a Fourier transform into the frequency domain and consideration of the phase of the result of the Fourier transform.

Magnetic resonance measurement data MD is acquired on the basis of the planned k-space trajectory kTr(F) (Block 107).

Image data BD is reconstructed from the acquired magnetic resonance measurement data MD (Block 109).

The planned k-space trajectory kTr(F) is corrected on the basis of the at least one frequency component F of the planned k-space trajectory kTr(F) and the loaded characterizing parameters (Block 105). The result of the correction is a corrected k-space trajectory kTr_c.

For the correction of the planned k-space trajectory kTr(F) the readout gradients which have a frequency component F of the planned k-space trajectory kTr(F) can be corrected. Thus the correction of the planned k-space trajectory k-TR (F) can in each case be performed in the direction of an axis of the gradient unit, corresponding to a gradient direction $G_x$, $G_y$ or $G_z$, for which the characterizing parameters used apply.

FIG. 6 schematically shows a comparison of a gradient G of a planned k-space trajectory having a frequency component and of a corrected gradient G' of a corrected k-space trajectory, determined on the basis of parameters characterizing a gradient unit used and of the planned k-space trajectory.

The gradient G of the planned k-space trajectory and of the corrected gradient G' of the corrected k-space trajectory have different magnitudes and are deferred with respect to one another. In the example shown the gradient G of the planned k-space trajectory has a maximum magnitude M and the corrected gradient G' of the corrected k-space trajectory has a (smaller) magnitude M'. The progression of the corrected gradient G' starts with a temporal delay d compared to the gradient G. The frequency component and the overall duration of the progressions of the gradient G and of its corresponding corrected gradient G' remain the same.

The value of the magnitude M' of the corrected gradient of the corrected k-space trajectory can be determined on the basis of the value of the magnitude M of the gradient of the planned k-space trajectory and of a parameter $P_M$ describing magnitudes achieved in the frequency domain and characterizing the gradient unit used, using the frequency component F of the planned k-space trajectory. To determine the value of the magnitude M' of the corrected gradient the value of the parameter $P_M$ describing achieved magnitudes which corresponds to the frequency component F of the planned k-space trajectory can simply be multiplied here by the magnitude M of the gradient G of the planned k-space trajectory.

In FIG. 4, an example of a value $M_c$ of the parameter $P_M$ corresponding to the frequency component F has been plotted in the frequency domain f for the possible progression shown of a parameter $P_M$ describing achieved magnitudes. Thus for this case the following would apply: $M'=M*M_c$.

The method thus allows a correction of deviations in the magnitude just from knowledge of parameters P characterizing the gradient unit used as a function of the frequency component F of the k-space trajectory used, for which very little computational effort is necessary.

The value of the time delay d of the corrected gradient of the corrected k-space trajectory can be determined on the basis of the value of the frequency component and of a parameter $P_D$ describing achieved phases in the frequency domain and characterizing the gradient unit used, using the frequency component F of the planned k-space trajectory. To determine the value of the delay d of the corrected gradient, the absolute value of the value of the parameter $P_D$ describing achieved phases which corresponds to the frequency component F of the planned k-space trajectory can simply be divided here by the value of the frequency component F.

In FIG. 5 an example of a value $Ph_c$ of the parameter $P_D$ corresponding to a frequency component F has been plotted in the frequency domain f for the possible progression shown of a parameter $P_D$ describing achieved phases. Thus for this case the following would apply: $d=abs(Ph_c)/F$.

The method thus allows a correction of time delays just from knowledge of parameters P characterizing the gradient unit used as a function of the frequency component F of the k-space trajectory used, for which very little computational effort is necessary.

The corrected k-space trajectory kTr_c which can be easily derived by way of the corrected gradient G' can thus be determined from the planned k-space trajectory kTr(F) with little computational effort on the basis of the at least one frequency component F of the planned k-space trajectory and of a value, associated with the frequency component F, of a loaded characterizing parameter P, in particular from parameters $P_M$ and $P_D$ which can be derived from parameters P describing a behavior of a gradient unit and which describe magnitudes and phases achieved.

The k-space trajectory kTr_c corrected in this way can be used as a starting value for a further correction (Block 111). A further correction that can be considered is in particular iteratively working corrections, such as e.g. model-based or PSF-based methods as are known for example from the above-mentioned article by Cauley et al., which although they deliver very accurate results may require long times as a result of their iterative progression until they converge sufficiently. By using a k-space trajectory kTr_c already corrected on the basis of a frequency component F of a planned k-space trajectory kTr(F) and parameters P characterizing a gradient unit used as a starting value for such an iterative correction 111 the time needed for a convergence of the further correction 111 can be considerably reduced, and a further corrected k-space trajectory kTr_c' can be obtained which lies still closer to the k-space trajectory actually achieved with the gradient unit. Additionally or alternatively a further correction 111 can include an adjustment to an inclination of axes x', y', z' of a planned measurement area compared to the gradient axes x, y, z of the magnetic resonance system. Such an inclination means that at least one of the axes x', y' and z' does not match the gradient axes x, y, z. The correction values determined for the gradient axes x, y, z can be transposed, e.g. by means of interpolation, into correction values for the axes x', y', z'.

The correction 105 of the planned k-space trajectory kTr(F) on the basis of the frequency component F and of the characterizing parameters P can be performed before the magnetic resonance measurement data MD is acquired, such that the magnetic resonance measurement data MD can be acquired along corrected k-space trajectories kTr_c (FIG. 1, branch a).

The further correction 111 of the planned k-space trajectory kTr(F) can also be performed before the magnetic resonance measurement data MD is acquired, such that the magnetic resonance measurement data MD is acquired along corrected k-space trajectories kTr_c' (FIG. 1, branch a). If necessary a preliminary measurement of reference magnetic resonance data potentially usable in connection with the further correction 111 can take place before a further correction 111 is performed.

An acquisition 107 of the measurement data MD along corrected k-space trajectories kTr_c or kTr_c' corresponds to a prospective correction. To this end the planned k-space trajectory kTr(F) can be modified such that the corrected k-space trajectory kTr_c or kTr_c' used in the acquisition of the measurement data MD corresponds to the actually desired k-space trajectory.

If for example the k-space trajectory kTr_c corrected on the basis of the frequency component F and of the characterizing parameters P is to be used in the acquisition 107 of the measurement data MD, the planned k-space trajectory kTr(F) can be modified by anticipating the correction 105 of the planned k-space trajectory, such that the corrected k-space trajectory kTr_c obtained by the correction 107 corresponds to the k-space trajectory desired for the acquisition 107 of the measurement data MD. Analogously to the example described with reference to FIGS. 4 and 6, a magnitude M of a gradient G of a modified planned k-space trajectory M having a frequency component F can be determined by dividing the (desired) magnitude M' of the corrected gradient G' by the value of the parameter $P_M$ which describes achieved magnitudes and which corresponds to the frequency component F of the planned k-space trajectory.

The following would apply: $M=M'/M_c$.

Analogously to the example described with reference to FIGS. 5 and 6, a (preliminary) time delay d of a gradient G of a modified planned k-space trajectory M having a frequency component F can be determined, by bringing forward the (desired) starting time of the planned k-space trajectory by the value determined for d.

Corrected k-space trajectories kTr_c or kTr_c' can be used in the reconstruction 109 of the image data BD to prevent reconstruction errors based on deviations from gradients actually generated during a measurement during a readout period from the respective gradients planned for this readout period (FIG. 1, branch b). The correction 105 of the planned k-space trajectory kTr(F) and/or the further correction 111 of the planned k-space trajectory kTr(F) can be performed here on the basis of the frequency component F and the characterizing parameters P, after the magnetic resonance measurement data MD has been acquired.

A use of corrected k-space trajectories kTr_c or kTr_c' in connection with the reconstruction 109 of the image data BD corresponds to a retrospective correction. Artifacts are prevented by using corrected k-space trajectories kTr_c or kTr_c' in the reconstruction 109 of the image data BD which corresponds to the k-space trajectories actually generated by the gradient unit used.

A combination of prospective and retrospective correction is for example conceivable if on the basis of the frequency component F and the characterizing parameters P corrected k-space trajectories kTr_c for a prospective correction and by means of a further correction 111 further corrected k-space trajectories kTr_c' for a retrospective correction are used, and/or if e.g. a prospective correction is performed only for one or two of the gradient axes x, y and z, and a retrospective correction is performed for the gradient axis/axes not covered by the prospective correction.

Interim results, as well as the reconstructed image data BD, can be saved and/or displayed.

FIG. 7 schematically represents an inventive magnetic resonance system 1. This comprises a magnet unit 3 for generating the constant magnetic field, a gradient unit (gradient coil system) 5 with, e.g. three, gradient coils (not shown individually) acting in the x, y and z direction for generating gradient fields, a radio-frequency (RF) transceiver 7 for beaming and receiving radio-frequency signals, and a controller 9 embodied to perform an inventive method.

In FIG. 7 these subunits of the magnetic resonance system 1 are only shown roughly and schematically. In particular the RF transceiver 7 can consist of multiple subunits, for example multiple coils such as the schematically shown coils 7.1 and 7.2 or more coils, which can be embodied either only for transmitting radio-frequency signals or only for receiving the triggered radio-frequency signals or for both.

To examine an object under examination U, for example a patient or also a phantom, the latter can be introduced on a patient table L into the measurement volume of the magnetic resonance system 1. The slice or the slab S represents an exemplary target volume of the object under examination, from which data is to be recorded and acquired as measurement data.

In an exemplary embodiment, controller 9 is configured to control the magnetic resonance system 1 and control the gradient unit 5 by means of a gradient controller 5' and the RF transceiver 7 by means of a radio-frequency transceiver controller 7'. The RF transceiver 7 may include multiple channels, on which signals can be transmitted or received. In an exemplary embodiment, the controller 9 includes processing circuitry that is configured to perform one or more functions/operations of the controller 9. In one or more aspects, one or more of the components of the controller 9 may include processing circuitry that is configured to perform one or more respective functions/operations of the component(s).

The RF transceiver 7 is, together with its radio-frequency transceiver controller 7', responsible for generating and beaming (transmitting) a radio-frequency alternating field for manipulation of the spins in an area to be manipulated (for example in slices S to be measured) of the object under examination U. In this case the center frequency of the radio-frequency alternating field, also designated as the B1 field, is generally set wherever possible such that it lies close to the resonance frequency of the spins to be manipulated. Deviations of the center frequency from the resonance frequency are designated as off-resonance. To generate the B1 field, currents controlled by means of the radio-frequency transmit/receive controller 7' are applied to the RF coils in the RF transceiver 7.

The controller 9 further comprises a corrector 15, with which an inventive correction can be performed. The controller 9 is overall embodied to perform an inventive method.

A computer 13 comprised by the controller 9 is embodied to execute all computing operations needed for the necessary measurements and determinations. To this end, interim results and results required or hereby determined can be stored in a memory storage unit (memory) S of the controller 9. The units represented are here not necessarily to be understood as physically separate units, but merely represent a subdivision into logical units, which however can for example also be implemented in a few or even in just one single physical unit.

An input/output device E/A of the magnetic resonance system 1 can be used, e.g. by a user, to pass control commands to the magnetic resonance system and/or results of the controller 9 such as e.g. image data can be displayed.

A method described herein can also be present in the form of a computer program product which comprises a program and implements the described method on a controller 9 when it is executed on the controller 9. An electronically readable data medium 26 with electronically readable control information stored thereon can likewise be present, which comprises at least one such computer program product as just described and is configured such that when the data medium 26 is used in a controller 9 of a magnetic resonance system 1 it performs the described method.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for recording measurement data using a magnetic resonance (MR) system having a gradient unit, the method comprising:
    loading frequency-dependent parameters characterizing the gradient unit;
    loading a k-space trajectory planned for a MR measurement and having at least one frequency component;
    acquiring MR measurement data based on the planned k-space trajectory and reconstructing image data from the MR measurement data, wherein the planned k-space trajectory is corrected based on the at least one frequency component of the planned k-space trajectory and the frequency-dependent parameters; and
    providing an electronic signal representing the reconstructed image data as an output of the MR system.

2. A magnetic resonance (MR) system comprising:
    one or more gradient coils; and
    a controller configured to:
        access frequency-dependent parameters characterizing the one or more gradient coils;
        access a k-space trajectory planned for a MR measurement and having at least one frequency component;
        control the MR system to acquire MR measurement data based on the planned k-space trajectory; and
        reconstruct image data from the MR measurement data, wherein the planned k-space trajectory is corrected based on the at least one frequency component of the planned k-space trajectory and the frequency-dependent parameters.

3. The method as claimed in claim 1, wherein the frequency-dependent parameters characterizing the gradient unit are based on measured gradient impulse response functions (GIRF).

4. The method as claimed in claim 1, wherein the frequency-dependent parameters are loaded at least for one axis of the gradient unit.

5. The method as claimed in claim 4, wherein the correction of the planned k-space trajectory is, in each case, performed in a direction of an axis of the gradient unit, for which the frequency-dependent parameters used are applicable.

6. The method as claimed in claim 1, wherein the correction of the planned k-space trajectory is performed before the MR measurement data is acquired, such that the MR measurement data is acquired along corrected k-space trajectories.

7. The method as claimed in claim 1, wherein the correction of the planned k-space trajectories takes place after the acquisition of the MR measurement data.

8. The method as claimed in claim 1, wherein the k-space trajectory corrected based on: at least one frequency component of the planned k-space trajectory, the frequency-dependent parameters being used as a starting value for a further correction.

9. The method as claimed in claim 1, wherein providing the electronic signal representing the reconstructed image data comprises storing and/or displaying the reconstructed image data.

10. A computer program product, embodied on a non-transitory computer-readable storage medium, having a computer program and which is directly loadable into a memory of the MR system, when executed by a processor of the MR system, causes the processor to perform the method as claimed in claim 1.

11. A non-transitory computer-readable storage medium with an executable program stored thereon, that when executed, instructs a processor to perform the method of claim 1.

12. The MR system as claimed in claim 2, wherein the controller is further configured to generate an electronic output signal representing the reconstructed image data.

13. The method as claimed in claim 1, wherein the frequency-dependent parameters indicate one or more characteristics of a gradient field generated by the gradient unit.

14. The method as claimed in claim 13, wherein the one or more characteristics include a magnitude of the gradient field generated by the gradient unit.

15. The method as claimed in claim 13, wherein the one or more characteristics include a phase of the gradient field generated by the gradient unit.

16. The method as claimed in claim 1, wherein the frequency-dependent parameters indicate a progression of one or more characteristics of a gradient field generated by the gradient unit.

17. The method as claimed in claim 16, wherein the one or more characteristics include a magnitude and/or a phase of the gradient field generated by the gradient unit.

* * * * *